United States Patent [19]
Proebsting

[11] Patent Number: 5,939,919
[45] Date of Patent: Aug. 17, 1999

[54] CLOCK SIGNAL DISTRIBUTION METHOD FOR REDUCING ACTIVE POWER DISSIPATION

[75] Inventor: Robert J. Proebsting, Los Altos Hill, Calif.

[73] Assignee: Hyundai Electronics America Inc, San Jose, Calif.

[21] Appl. No.: 08/901,594

[22] Filed: Jul. 28, 1997

Related U.S. Application Data

[60] Provisional application No. 60/025,984, Sep. 12, 1996.

[51] Int. Cl.$^6$ ...................................................... H03K 1/04
[52] U.S. Cl. ........................ 327/295; 327/291; 327/299; 327/166
[58] Field of Search ..................................... 327/156, 159, 327/165, 166, 299, 291, 295; 364/270.3, 270, 271

[56] References Cited

U.S. PATENT DOCUMENTS

| | | | |
|---|---|---|---|
| 4,105,979 | 8/1978 | Kage | 327/166 |
| 4,430,745 | 2/1984 | Betts | 375/25 |
| 5,125,009 | 6/1992 | DeVilbiss | 375/107 |
| 5,150,068 | 9/1992 | Kawashima et al. | 328/155 |
| 5,481,573 | 1/1996 | Jacobowitz et al. | 375/356 |
| 5,570,054 | 10/1996 | Takla | 327/295 |
| 5,781,049 | 7/1998 | Fugo | 327/165 |

FOREIGN PATENT DOCUMENTS

| | | |
|---|---|---|
| 0 726 576 | 8/1996 | European Pat. Off. . |
| 40 20 719 | 1/1992 | Germany . |
| WO 8403011 | 8/1984 | WIPO . |

OTHER PUBLICATIONS

"Frequency Modulator for Low Power Digital Integrated Circuit Applications," *IBM Technical Disclosure Bulletin*, vol. 37, No. 11, Nov. 1, 1994, pp. 553–555, XP000487336.

*Primary Examiner*—Timothy P. Callahan
*Assistant Examiner*—Jung Ho Kim
*Attorney, Agent, or Firm*—Townsend & Townsend & Crew

[57] ABSTRACT

A clocking scheme is provided which uses an external clock signal having a frequency F, and generates an internal master clock signal equal having a frequency lower than (e.g., ½) F. The internal master clock signal operating at, for example, half the speed of the external clock is routed throughout a device to components on the device requiring a clock signal (e.g., input or output buffers in a synchronous memory product). A stream of narrow pulses corresponding to rising and falling edges of the internal master clock signal are locally generated for those components which require a clock signal at full frequency. This stream of narrow pulses has a frequency of F.

9 Claims, 3 Drawing Sheets

CLOCK SIGNAL DISTRIBUTION METHOD FOR REDUCING ACTIVE POWER DISSIPATION

This application claims the benefit of U.S. Provisional Application No. 60/025,984, filed Sep. 12, 1996, the disclosure of which is incorporated by reference.

BACKGROUND OF THE INVENTION

The present invention relates to digital circuits. In particular, the present invention relates to clocking schemes for digital circuits.

Low power has emerged as a major issue in the electronics industry. Previously, the major concerns in microelectronics were performance, area, cost, and reliability, with power generally only of importance if some cooling limit were being exceeded or if devices were battery operated. As chip densities and clock speeds increase, and as more and more equipment are made portable and battery operated, power consumption has become of critical importance.

A primary component of power dissipation in CMOS logic circuitry is active power dissipation. Active power dissipation (disregarding contributions from DC and non-capacitive currents, such as short-circuit currents) is calculated by $P=C*V_{dd}^2*f$, where P is power, C is load capacitance, $V_{dd}$ is the power-supply voltage, and f is the switching frequency at which the circuit is operated.

Active power dissipation is most directly influenced by the magnitude of the supply voltage $V_{dd}$. Thus, a trend among digital designers is to reduce the supply voltage. However, the amount by which the supply voltage can be reduced is limited so that further gains along this avenue are difficult to achieve.

Although reductions in the switching frequency may also result in reduced active power dissipation, such a reduction is at odds with the need for increased device operating speeds. This problem is compounded by the increased use of synchronous devices, such as synchronous dynamic or static memory devices (SDRAMs or SSRAMs). These synchronous devices employ a master clock which controls all features of a device. For example, in a synchronous SRAM, the master clock controls the input, storage, and output of data from the memory. Active power dissipation is increased due to the need to route the high frequency master clock signal throughout the device. This power dissipation, however, is generally accepted as a necessary expense to attain high frequencies of operation.

It is desirable to reduce the active power dissipation in such a device while permitting high frequency operation.

SUMMARY OF THE INVENTION

Accordingly, a clocking scheme is provided which uses an external clock signal having a frequency F, and generates an internal master clock signal having a frequency that is lower than (e.g., ½) F. The internal master clock signal operating at, for example, half the speed of the external clock is routed throughout a device to components on the device requiring a clock signal (e.g., input or output buffers in a synchronous memory product). A stream of narrow pulses corresponding to rising and falling edges of the master clock signal are locally generated for those components which require a clock signal. This stream of narrow pulses has a frequency of F. In this manner, active power dissipation associated with the master clock signal generation is reduced almost by half, yet the integrated circuit may still operate at a high frequency.

Embodiments of the present invention permit continued operation at high frequencies while attaining appreciable reductions in total power dissipation. These reductions in power dissipation are attained by generating a reduced frequency master clock signal equal to one-half the frequency of the external clock signal. The reduced frequency master clock signal is routed throughout the device to provide control for those circuit elements requiring a clock. This reduces power dissipation in driving the internal master clock by a factor of two. The master clock is often routed to many circuits inside the chip so the capacitance associated with the wiring of the clock signal is quite significant. Cutting the frequency of this high capacitance clock signal by a factor of two decreases the total power consumption of the part by a significant amount.

For a fuller understanding of the nature and advantages of the invention, reference should be made to the ensuing description taken in conjunction with the accompanying drawings.

DESCRIPTION OF THE PREFERRED EMBODIMENT

Figure 1:
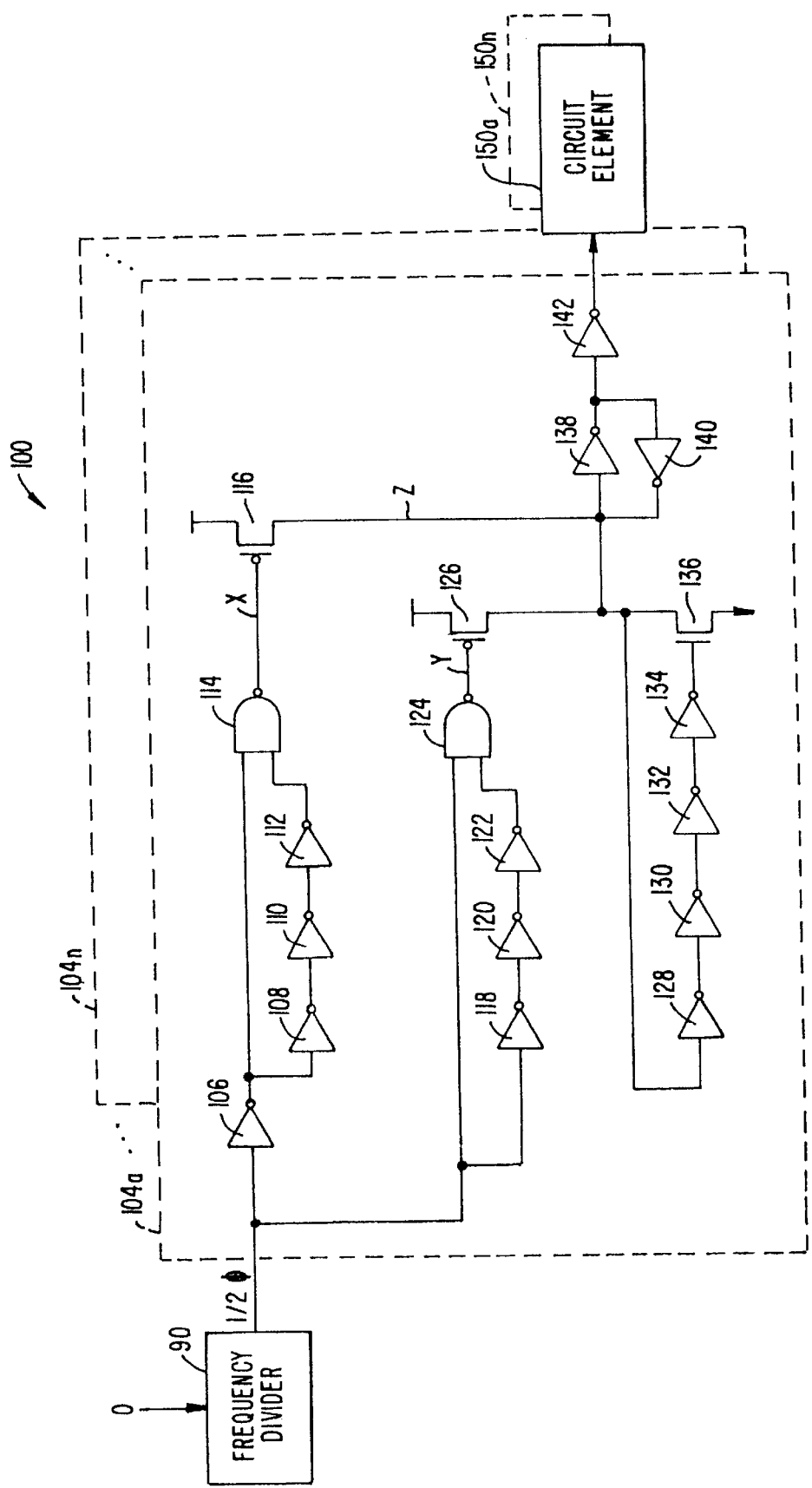
FIG. 1 is a diagram depicting a circuit for producing clock pulses according to one embodiment of the present invention.

Embodiments of the present invention may be used in conjunction with a number of different devices. In one specific embodiment, features of the present invention are used in conjunction with a synchronous memory device such as the synchronous memory described in U.S. Pat. No. 5,713,005 entitled "Method and Apparatus for Pipelining Data in an Integrated Circuit," filed Feb. 10, 1995, the contents of which are incorporated herein by reference for all purposes. Referring now to FIG. 1, a clock-driven device 100 is shown. Clock-driven device 100 may be any clock-driven circuit, such as a synchronous memory device.

An input clock signal Φ is received by the device. For example, if the device is a 200 MHz synchronous memory device, input clock signal Φ is a 200 MHz clock signal. The input clock signal Φ is input to a frequency divider 90 to produce a reduced frequency clock signal equal to ½Φ, or half the frequency of the input clock signal. This reduced frequency clock signal ½Φ is routed throughout the device rather than buffering and routing the input clock signal Φ, thereby reducing the dissipation of the internal clock buffering circuitry.

Merely halving the clock frequency, however, would lead to slower device operation. According to embodiments of the present invention, clock pulses corresponding to the rising and falling edges of the master clock signal Φ are created where needed. Still referring to FIG. 1, a plurality of clock circuits 104a–n are provided on clock-driven device 100. These clock circuits 104 are used to generate a pulse stream. The pulse stream is generated from the reduced frequency clock signal ½Φ, and corresponds to the rising and falling edges of the master clock signal Φ. The pulse stream may then be used to control circuit elements (or sub-circuits) 150a–n. Circuit elements 150a–n are elements which require clock control, such as data input or output buffers.

Figure 2:
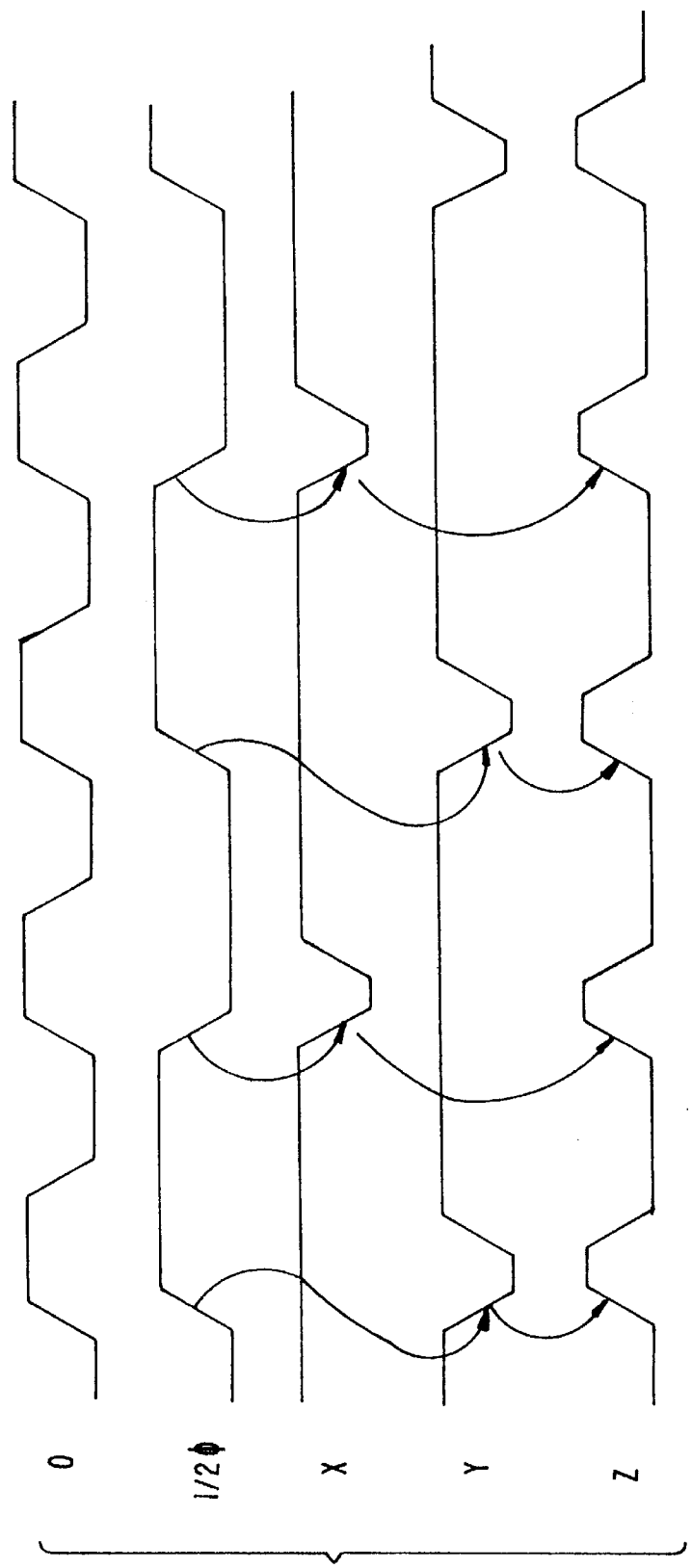
FIG. 2 is a timing diagram depicting operation of the clock pulses generated according to FIG. 1.

In one specific embodiment, each clock circuit 104 receives the reduced frequency master clock signal ½Φ. A rising edge on the reduced frequency clock signal causes NAND gate 124 to generate a narrow negative pulse (e.g., approximately equal in width to the combined delay of inverters 118, 120, 122). This narrow negative pulse at node Y turns on PMOS transistor 126, creating a positive transition on node Z, overpowering weak (i.e., small device sizes) inventor 140 of the latch formed by inverters 138 and 140. The positive transition on node Z causes a negative transition on the output of inverter 128, a positive transition on the output of inverter 130, a negative transition on the output of inverter 132 and a positive transition on the output of inverter 134, and the gate of transistor 136. The positive transition on the gate of NMOS transistor 136 pulls node Z low, again overpowering tiny inverter 140. Note that this occurs four inverter delays after node Z was pulled high by a negative pulse on node Y (or node X) which was only three inverter delays wide. Therefore, PMOS transistor 126 (or 116) is off before node Z is pulled to ground. Four inverter delays after node Z is pulled to ground transistor 136 is turned off, allowing node Z to again be pulled high. The positive pulse on node Z is buffered by inverters 138 and 142 to drive a positive pulse to circuit element 150. Similarly, a falling edge on the reduced frequency clock signal ½Φ causes NAND gate 114 to generate a negative pulse at node X, which briefly turns on PMOS transistor 116 to produce a positive transition at node Z which is again terminated by NMOS transistor 136. This sequence of events is shown in the timing diagram of FIG. 2.

Thus, power dissipation is reduced by avoiding the need to distribute a high frequency master clock signal Φ throughout the clock-driven device 100. Instead, a reduced frequency clock signal ½Φ is distributed throughout the device. The reduced frequency clock signal ½Φ is then used to generate a pulse stream corresponding to the rising and falling edges of the master clock signal ½Φ, which in turn corresponds to the rising edges of the input clock signal Φ. The pulse stream controls those components of the clock-driven device which require master clock control. The result is an ability to operate a clock-driven device at high frequencies at reduced levels of active power dissipation in generating the internally buffered clock signal.

As will be appreciated by those familiar with the art, the present invention may be embodied in other specific forms without departing from the spirit or essential characteristics thereof. For example, in a further specific embodiment, features of the present invention are used to control the flow of data through a synchronous memory device. A delayed version of the reduced frequency clock signal ½Φ may be used to steer data to different latches for pipelining purposes in a synchronous memory device such as the device described in U.S. Pat. No. 5,713,005 referenced above and incorporated herein by reference. The technique of the present invention is specially suited for a two-deep pipeline wherein before a first piece of data asynchronously propagates through the entire data path, a second piece of data starts propagating through the same data path. Each piece of data is then steered to a storage unit (or latch) and then appropriately selected for output.

Figure 3:
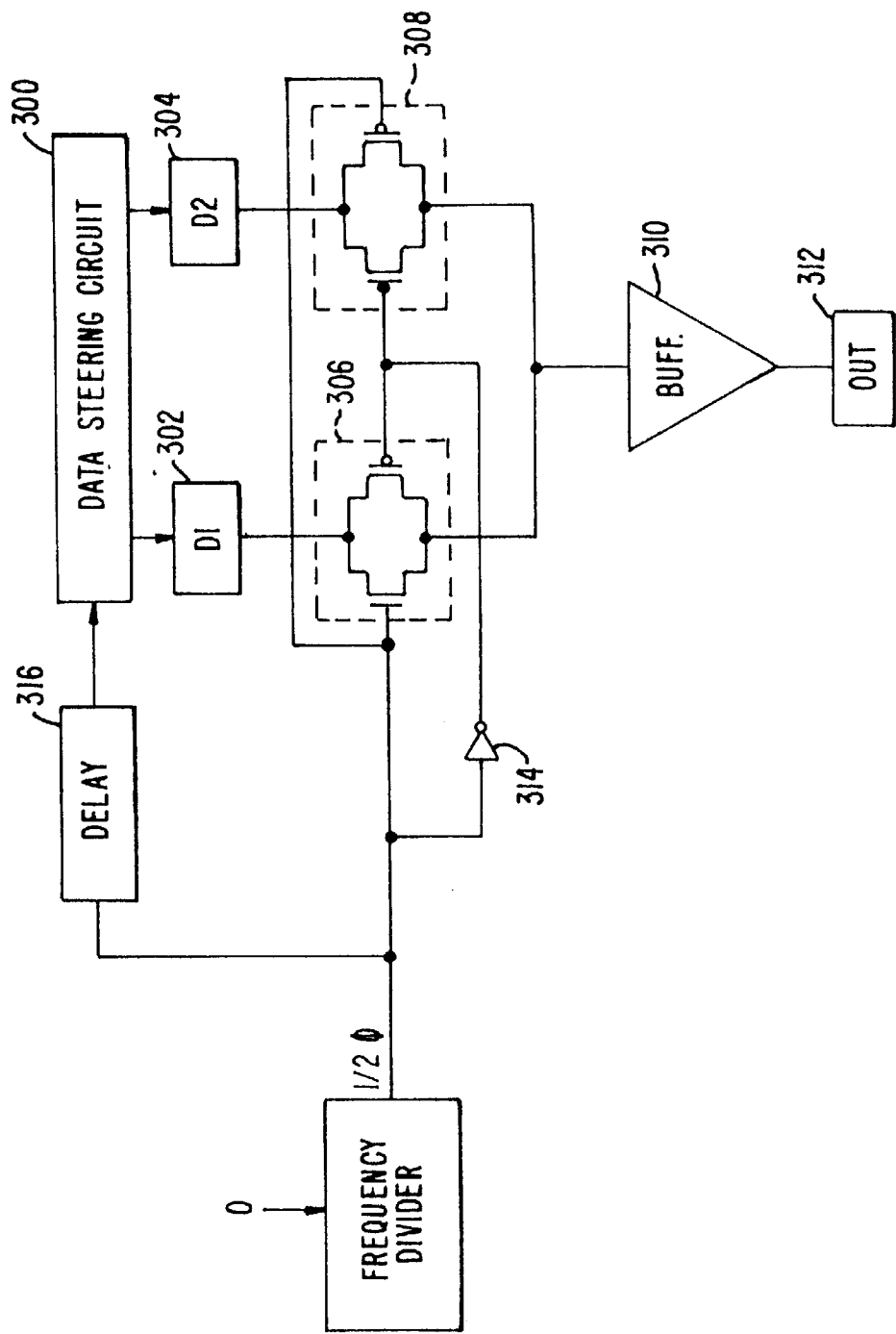
FIG. 3 is a pipelining circuit employing the clocking scheme of the present invention.

FIG. 3 shows a simplified implementation of data steering for a system having a two-deep pipeline that takes advantage of the clocking technique of the present invention. The system includes a data steering circuit 300 that steers first data into a storage unit D1 302, and second data into a second storage unit D2 304. Third data is again steered into storage unit D1 302. The timing of the steering is controlled by a version of the internal master clock signal ½Φ that is delayed by a delay block 316. The details of the timing and delay requirements are described in the above-referenced patent application Ser. No. 08/386,581, which has been incorporated by reference in its entirety. Selection elements made up of, for example, transmission gates 306 and 308 selectively couple either data from D1 302 or data from D2 304 to an output buffer 310, respectively. Transmission gates 306 and 308 are controlled by the ½Φ master clock and its inverse (generated by inverter 314). In this example, the positive transition of the ½Φ master clock steers the first data to output buffer 310 and the negative transition steers the second data to output buffer 310. This results in a reduction of circuitry needed to control the memory device, thereby further reducing power dissipation.

In conclusion, the present invention provides a clocking scheme whereby an external clock signal having a frequency F is divided in half internally to generate an internal master clock signal equal to ½ F. The internal master clock signal operating at half the speed of the external clock is routed throughout a device to components on the device requiring a clock signal (e.g., input or output buffers in a synchronous memory product). A stream of narrow pulses corresponding to rising and falling edges of the master clock signal are locally generated for those components which require a clock signal at its full frequency. While the above is a complete description of specific embodiments of the present invention, various modifications, variations and alternatives may be employed. For example, it is known by those skilled in this art that the internal master clock may be buffered or go through other circuitry before reaching the various local clock-driven sub-circuits. That is, while the specific embodiment described and depicted in FIG. 1 shows the same master clock signal driving each local clock circuit, a clock signal other than the very same internal master clock signal but having the same frequency as the internal master clock signal may be routed to various locations inside the integrated circuit. The scope of this invention, therefore, should not be limited to the embodiments described, and should instead be defined by the following claims.

What is claimed is:

1. A method for generating clock signals in an integrated circuit having a number of clock-driven sub-circuits, the method comprising the steps of:

receiving an external clock signal having a frequency F;

generating from said external clock signal an internal master clock signal having a frequency equal to ½ F;

routing said internal master clock signal, or a signal derived from said internal master clock signal, to each of said number of clock-driven sub-circuits inside the integrated circuit;

generating, a local clock signal from said internal master clock signal or from a signal derived from said internal master clock signal, said local clock signal having a frequency F;

applying said local clock signal to a respective one of said plurality of clock-driven sub-circuits propagating a first data and a second data in said integrated circuit in a pipelined fashion;

steering said first data to an output in response to a first edge of said master clock signal; and steering said second data to said output in response to a second edge opposite to said first edge of said master clock signal.

2. A clock driven circuit comprising:

a frequency divider having an input coupled to receive an external clock signal having frequency F, said frequency divider generating at an output an internal master clock having a frequency substantially equal to ½ F;

a circuit network coupled to said output of said frequency divider, said circuit network distributing said internal master clock across the circuit;

a plurality of clock-driven sub-circuits each having a clock input;

a plurality of clock circuits each having an input coupled to said circuit network for receiving said internal master clock or a clock signal derived from said internal master clock, and an output coupled to a clock input of respective one of said plurality of clock-driven sub-circuits;

a pipelined data path configured to propagate data in a pipelined fashion;

a steering circuit coupled to said data path;

first and second data storage units coupled to said steering circuit; and data selection circuit coupled to said first and second data storage units, said data selection circuit being configured to select data stored in said first and second storage units in response to rising and falling edges of said internal master clock, respectively;

wherein, said plurality of clock circuits regenerate at their respective outputs a clock signal having a frequency equal to F.

3. The clock driven circuit of claim 2 wherein said data selection circuit comprises a first switch coupled between said first data storage unit and an output, and a second switch coupled between said second data storage unit and the output.

4. The clock driven circuit of claim 3 wherein each of said first and second switches comprises an MOS transistor having a first source/drain terminal coupled to its associated data storage unit and a second source/drain terminal coupled to the output.

5. The clock driven circuit of claim 4 wherein each of said first and second switches comprises a pair of complementary MOS transistors coupled in parallel.

6. A clock driven circuit comprising:

a frequency divider having an input coupled to receive an external clock signal having frequency F, said frequency divider generating at an output an internal master clock having a frequency substantially equal to ½ F;

a circuit network coupled to said output of said frequency divider, said circuit network distributing said internal master clock across the circuit;

a plurality of clock-driven sub-circuits each having a clock input;

a plurality of clock circuits each having an input coupled to said circuit network for receiving said internal master clock or a clock signal derived from said internal master clock, and an output coupled to a clock input of respective one of said plurality of clock-driven sub-circuits, wherein each one of said plurality of clock circuits further comprises:

a first pulse generating circuit having an input coupled to said internal master clock, said first pulse generating circuit generating a pulse on every rising edge of said internal master clock signal;

a second pulse generating circuit having an input coupled to said internal master clock, said second pulse generating circuit generating a pulse on every falling edge of said internal master clock signal; and a combine circuit for combining an output of said first pulse generating circuit with an output of said second pulse generating circuit, said combine circuit generating a signal at its output having a frequency equal to F.

7. The clock driven circuit of claim 6 wherein said clock driven circuit comprises a synchronous memory circuit.

8. The clock driven circuit of claim 6 further comprising:

a pipelined data path configured to propagate data in a pipelined fashion;

a steering circuit coupled to said data path;

first and second data storage units coupled to said steering circuit; and data selection circuit coupled to said first and second data storage units, said data selection circuit being configured to select data stored in said first and second storage units in response to rising and falling edges of said internal master clock, respectively.

9. The clock driven circuit of claim 8 wherein said data selection circuit comprises:

a first transmission gate coupling an output of said first data storage unit to a circuit output; and a second transmission gate coupling an output of said second data storage unit to the circuit output, wherein said first transmission gate conducts in response to a first edge of said internal master clock, and said second transmission gate conducts in response to a second edge opposite to said first edge of said internal master clock signal.

* * * * *